(12) United States Patent
Sakai et al.

(10) Patent No.: US 12,338,548 B2
(45) Date of Patent: Jun. 24, 2025

(54) PROTECTIVE STRUCTURE FOR SILICON ROD AND METHOD FOR MANUFACTURING SILICON ROD

(71) Applicant: TOKUYAMA CORPORATION, Yamaguchi (JP)

(72) Inventors: Junya Sakai, Yamaguchi (JP); Kazuhiro Kawaguchi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 549 days.

(21) Appl. No.: 17/619,521

(22) PCT Filed: May 28, 2020

(86) PCT No.: PCT/JP2020/021089
§ 371 (c)(1),
(2) Date: Dec. 15, 2021

(87) PCT Pub. No.: WO2020/255664
PCT Pub. Date: Dec. 24, 2020

(65) Prior Publication Data
US 2022/0380935 A1  Dec. 1, 2022

(30) Foreign Application Priority Data

Jun. 17, 2019  (JP) .................................. 2019-111967

(51) Int. Cl.
*C30B 35/00* (2006.01)
*C01B 33/035* (2006.01)
*C30B 29/06* (2006.01)

(52) U.S. Cl.
CPC ............ *C30B 35/00* (2013.01); *C01B 33/035* (2013.01); *C30B 29/06* (2013.01)

(58) Field of Classification Search
USPC ....... 118/504, 505, 303, 307–309, 500, 728; 427/248.1
See application file for complete search history.

(56) References Cited

U.S. PATENT DOCUMENTS

| | | | |
|---|---|---|---|
| 2010/0043972 | A1 | 2/2010 | Baldi et al. |
| 2011/0203101 | A1 | 8/2011 | Gum et al. |

(Continued)

FOREIGN PATENT DOCUMENTS

| | | |
|---|---|---|
| CN | 208155057 | 11/2018 |
| JP | 10-102644 | 4/1998 |

(Continued)

OTHER PUBLICATIONS

English Translation JP-10102644-A (Year: 1998).*

(Continued)

*Primary Examiner* — Yewebdar T Tadesse
(74) *Attorney, Agent, or Firm* — Casimir Jones, S.C.; Robert A. Goetz

(57) ABSTRACT

It is possible to carry out an operation to open a reactor while checking a falling over status of a silicon rod. A protective structure (200) includes: a first frame body (201) that is shaped so as to surround a bottom plate (101) of a reactor (100) in which a silicon rod (110) is contained; and a protective wall surface (204) that extends vertically upward from the first frame body (201) and that forms an storage space (210) for the silicon rod (110). The protective wall surface (204) has a mesh structure.

4 Claims, 11 Drawing Sheets

(56) References Cited

U.S. PATENT DOCUMENTS

2012/0237678 A1    9/2012   Bovo et al.
2016/0214864 A1    7/2016   Mueller et al.
2018/0015435 A1    1/2018   Jiang et al.

FOREIGN PATENT DOCUMENTS

| JP | 11-303082 | | 11/1999 |
|----|-----------|---|---------|
| JP | 2010-047470 | | 3/2010 |
| JP | 2011-525472 | | 9/2011 |
| JP | 2018530511 A | * | 10/2018 |
| WO | WO 2015-039841 | | 3/2015 |

OTHER PUBLICATIONS

English Translation JP2018530511A (Year: 2018).*
ISM Industrial Specialties Mfg. ISO 565-1990 and ISO 3310-1:2016 (Year: 2020).*
Extended European Search Report for 20826600.7. Jun. 23, 2023. 9 pages.
International Search Report for PCT/JP2020/021089 and its English translation, mailed Jul. 28, 2020, 3 pages.
International Preliminary Report on Patentability, PCT/JP2020/021089 and its English translation, mailed Jul. 28, 2020, 5 pages.
Office Action for SG Patent Application No. 11202113750R, dated Nov. 18, 2022, 9 pages.
Woven Wire Mesh: Glossary, Terminology & Measurement, [online], W.S. Tyler, [retrieved on Jan. 10, 2025], Internet <URL: https://blog.wstyler.com/woven-wire/woven-wire-mesh-glossary-terminology-measurement>.

* cited by examiner

PROTECTIVE STRUCTURE FOR SILICON ROD AND METHOD FOR MANUFACTURING SILICON ROD

TECHNICAL FIELD

The present invention relates to a protective structure that is used during the manufacture of a silicon rod, and to a method for manufacturing a silicon rod.

BACKGROUND ART

High-purity polysilicon is useful as a raw material for manufacturing single-crystal silicon for semiconductors by the Czochralski method (CZ method) or the floating zone method (FZ method). High-purity polysilicon is also useful as a raw material for manufacturing polycrystalline silicon for solar cells by a casting method to which a unidirectional solidification method is applied.

Polysilicon is typically manufactured by a Siemens process. In the Siemens process, a silicon-containing gas and hydrogen are put into a reactor, and the silicon-containing gas and the hydrogen that have been put into the reactor react with each other on a silicon core wire which is heated by the passage of electric current therethrough in the reactor, so that polysilicon is deposited on the silicon core wire. As the silicon-containing gas, monosilane ($SiH_4$) or trichlorosilane ($SiHCl_3$) is used.

The most common reactor is composed of a bell-shaped shell and a bottom plate which are made of metal and are capable of being cooled. The bottom plate is provided with many electrodes on which silicon core wires are set upright, an inlet through which a source material gas is to be introduced, and an outlet through which a gas inside the reactor is to be discharged.

The silicon core wires are each typically formed in a U-shape by two vertical rods and one horizontal bridge rod and are set upright in an inverted U-shape so as to be perpendicular to the electrodes provided on the bottom plate of the reactor. Polysilicon that is deposited on the silicon core wire grows with time in a direction in which the diameter of the silicon core wire extends. The reaction is ended when the diameter of the deposited polysilicon reaches a predetermined diameter. Silicon rods (polysilicon) which have stopped growing are cooled down typically to room temperature. Inverted U-shaped silicon rods thus obtained have a height of several meters and each have a weight of several tens of kilograms.

The silicon rods are taken out of the reactor after being cooled to room temperature. Since the Siemens process is not a continuous process but a batch process, it is necessary to temporarily shut down the reactor upon the end of the deposition, open the reactor, and take the obtained silicon rod out of the reactor. The reactor is opened typically by slowly lifting upward a cover of the reactor that is bell-shaped. The silicon rods are taken out of the reactor such that the inverted U-shaped silicon rods are lifted one by one and moved to the outside of the reactor. The silicon rods are loaded on, for example, a carrier and transferred.

For example, Patent Literature 1 discloses a protective wall-related technique that is used to take a silicon rod out of a reactor. Patent Literature 1 discloses a technique in which a non-air-permeable protective wall is provided around the reactor so that the surface of the silicon rod is prevented from being contaminated with outside air during opening of the reactor.

CITATION LIST

Patent Literature

[Patent Literature 1]
WO2015/039841 (Publication date: Mar. 26, 2015)

SUMMARY OF INVENTION

Technical Problem

However, an object of such a conventional technique as described above is to prevent contamination of a silicon rod, and therefore has the following problem. Specifically, according to the conventional technique, which fails to consider visibility from outside to inside of a protective wall, it is impossible to open a reactor while checking, from the outside of the protective wall, a falling over state of a silicon rod located inside the reactor.

The present invention has been made in light of the above-described conventional problem. An object of the present invention is to provide a protective structure which makes it possible to, while checking a falling over state of a silicon rod, carry out an operation to open a reactor.

Solution to Problem

In order to solve the above problem, a protective structure for a silicon rod in accordance with an aspect of the present invention includes a frame body that is shaped so as to surround a bottom plate of a reactor in which a silicon rod is contained; and a protective wall surface that extends vertically upward from the frame body and that forms a storage space for the silicon rod, the protective wall surface having a mesh structure.

A method for manufacturing a silicon rod, in accordance with an aspect of the present invention, includes a detaching step of detaching a cover from a bottom plate, together with which the cover forms a reactor in which the silicon rod is contained, the detaching step being carried out after a storage space of the silicon rod is formed by placing a protective structure including: a frame body that is shaped so as to surround the bottom plate and a protective wall surface that extends vertically upward from the frame body and that has a mesh structure.

Advantageous Effects of Invention

An aspect of the present invention makes it possible to, while checking a falling over state of a silicon rod, carry out an operation to open a reactor.

DESCRIPTION OF EMBODIMENTS

The following description will specifically discuss an embodiment of the present invention. For convenience of description, members having functions identical to those of the respective members described in variations of the embodiment are given respective reference signs, and a description of those members is omitted as appropriate. For convenience, the embodiment refers to a vertical direction assuming that a cover 103 side of a reactor 100 is an upper side and a bottom plate 101 side of the reactor 100 is a lower side. Note that the following description will refer to the vertical direction merely for convenience of description, and the present invention can be carried out in a direction that is not limited to the vertical direction.

(Configuration of Reactor)

Figure 1:
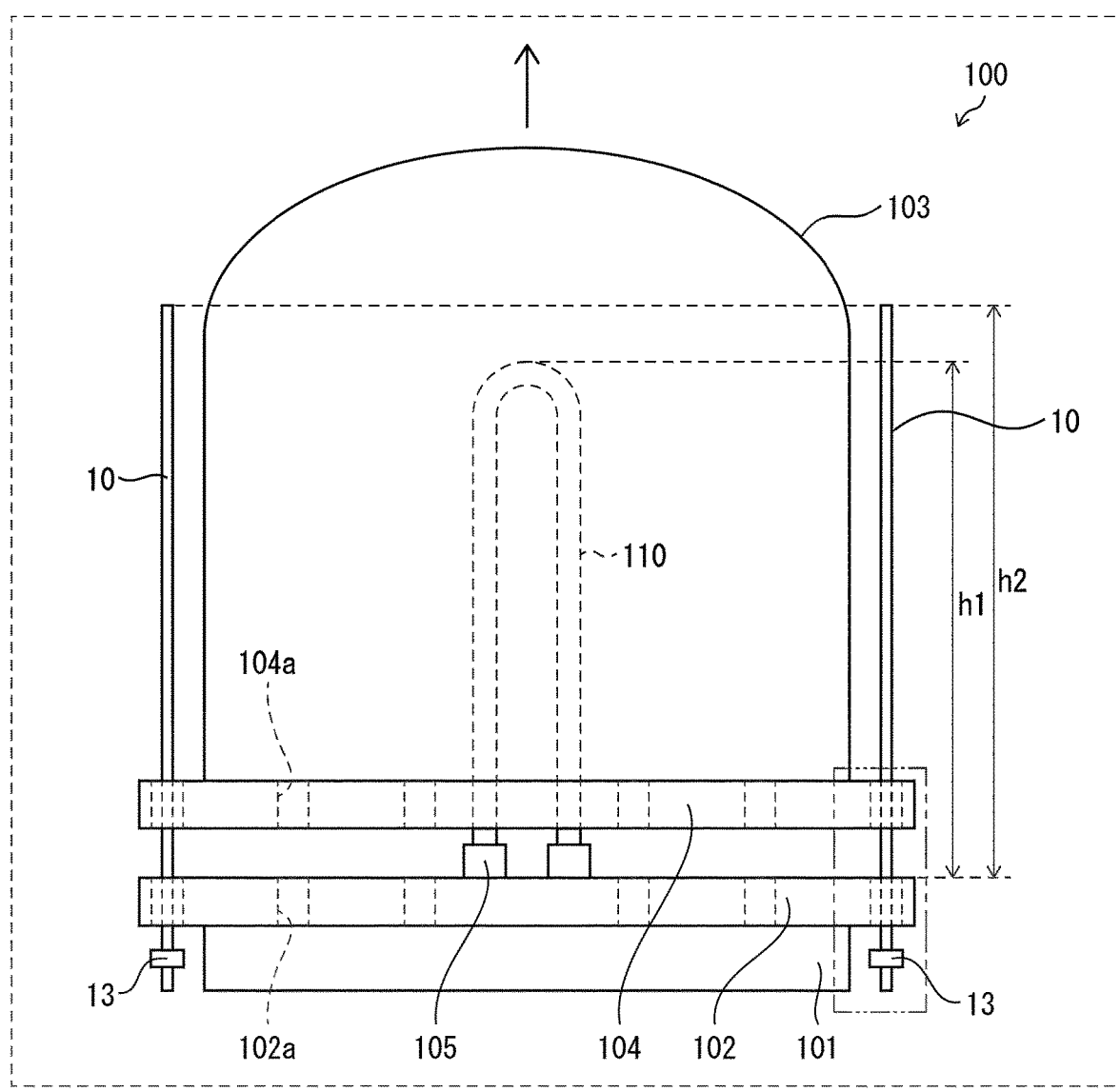
FIG. 1 is a side view illustrating how a cover of a reactor is detached from a bottom plate of the reactor while a rod-shaped body in accordance with an embodiment of the present invention is inserted in a bottom plate-side hole and in a cover-side hole.

The following description will schematically discuss a configuration of the reactor 100 with reference to FIG. 1. FIG. 1 is a side view illustrating how a cover 103 of the reactor 100 is detached from a bottom plate 101 of the reactor 100 while a rod-shaped body 10 in accordance with Embodiment 1 of the present invention is inserted in a bottom plate-side hole 102a and in a cover-side hole 104a. The cover 103 of the reactor 100 illustrated in FIG. 1 has been slightly lifted above the bottom plate 101.

The reactor 100 is a device for forming silicon rods 110 by using a Siemens process to deposit polysilicon on silicon core wires placed inside the device. The reactor 100 includes the bottom plate 101 and the cover 103.

The bottom plate 101 is made of metal and is substantially circular. The bottom plate 101 has a bottom plate flange 102 which is provided so as to surround the bottom plate 101. The bottom plate flange 102 has a plurality of bottom plate-side holes 102a provided in a circumferential direction of the bottom plate 101 at substantially regular intervals. The bottom plate-side holes 102a are provided so as to vertically pass through the bottom plate flange 102. Further, many electrodes 105 on which silicon core wires are set upright are provided on the bottom plate 101. The silicon core wires are each typically formed in a U-shape by two vertical rods and one horizontal bridge rod, and are set upright on the electrodes 105 in an inverted U-shape so as to be perpendicular to the bottom plate 101. As described earlier, the silicon rods 110 are formed by depositing polysilicon on the silicon core wires. FIG. 1 illustrates only one set of a silicon rod 110 and an electrode 105 for simplification of the drawing.

The cover 103 is made of metal and has a bell shape. The cover 103 has a cover flange 104 which is provided in a lower part of the cover 103 so as to surround the cover 103. The cover flange 104 has a plurality of cover-side holes 104a provided in a circumferential direction of the cover 103 at substantially regular intervals. The cover-side holes 104a are provided so as to vertically pass through the cover flange 104 and located so as to face the respective bottom plate-side holes 102a.

Note that bolt holes originally provided in the bottom plate flange 102 and the cover flange 104 can be used as the bottom plate-side holes 102a and the cover-side holes 104a. This makes it unnecessary to carry out any step of additionally providing the bottom plate-side holes 102a in the bottom plate 101 or additionally providing the cover-side holes 104a in the cover 103. The reactor 100 can be sealed by (i) bringing the bottom plate 101 into contact with a lower end of the cover 103 so that the bolt holes provided in the bottom plate flange 102 face the respective bolt holes provided in the cover flange 104 and (ii) passing bolts through the bolt holes and tightening the bolts.

(Rod-shaped body)

Figure 2:
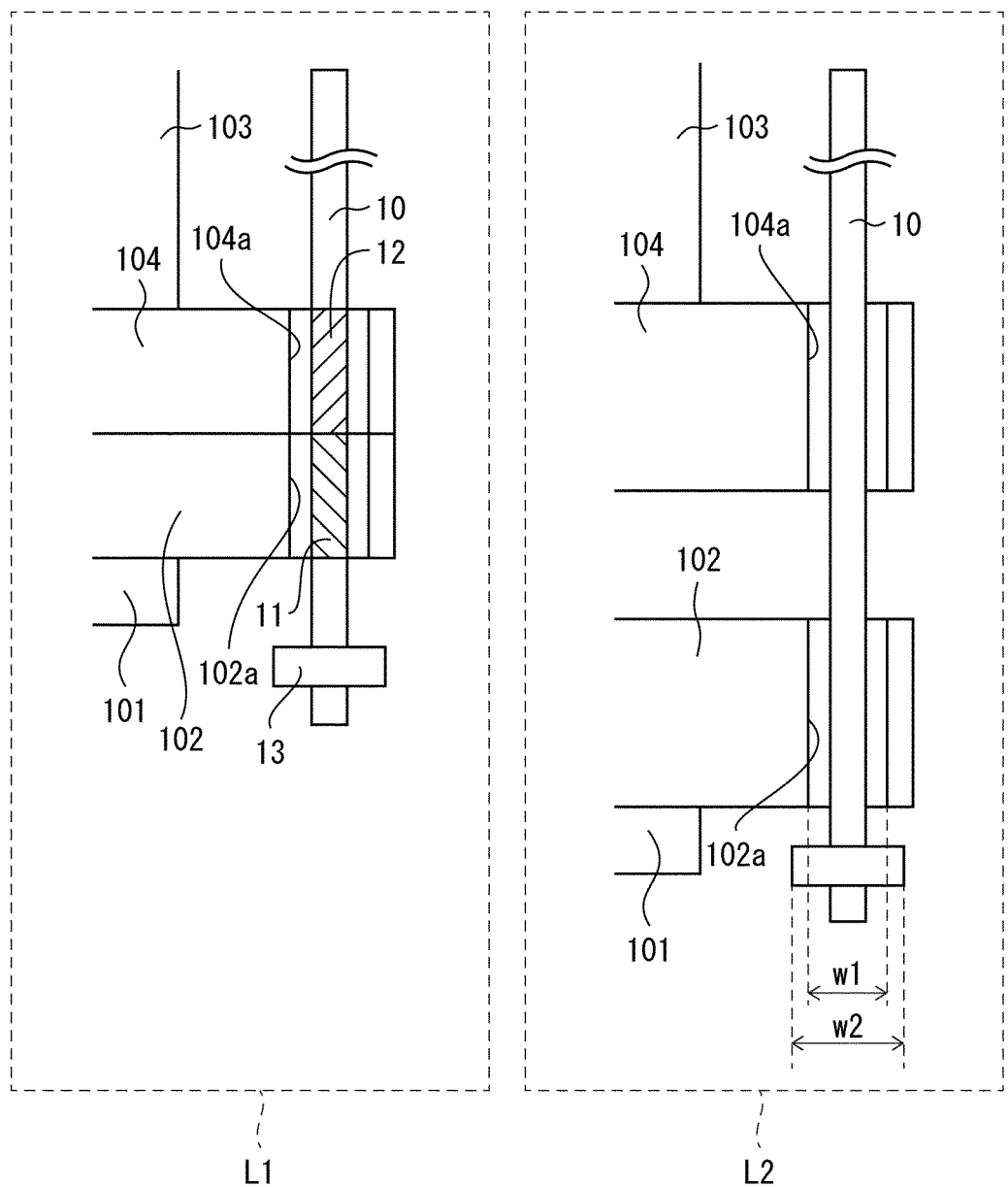
FIG. 2 is a cross-sectional view illustrating a state in which the rod-shaped body is inserted in the bottom plate-side hole and in the cover-side hole.

The following description will discuss the rod-shaped body 10 with reference to FIGS. 1 and 2. FIG. 2 is a cross-sectional view that describes a part illustrated in FIG. 1 and enclosed by a chain double-dashed line and that illustrates a state in which the rod-shaped body 10 is inserted in a corresponding bottom plate-side hole 102a and in a corresponding cover-side hole 104a. In FIG. 2, a diagram enclosed by a dotted line L1 illustrates a state in which the cover 103 has not been lifted, and a diagram enclosed by a dotted line L2 illustrates a state in which the cover 103 has been lifted slightly above the bottom plate 101. The rod-shaped body 10 (all fall guide) is used to lift the cover 103 so as to detach the cover 103 from the bottom plate 101, together with which the cover 103 forms the reactor 100 in which the silicon rod 110 is contained upright.

As illustrated in L1 of FIG. 2, the rod-shaped body 10 includes: a first part 11 to be inserted into the bottom plate-side hole 102a provided in a surrounding area of the bottom plate 101; and a second part 12 to be inserted into the cover-side hole 104a provided in a surrounding area of the cover 103 so as to face the bottom plate-side hole 102a. The rod-shaped body 10 includes a nonslip part 13 that is removably provided so as to be closer to a lower end of the rod-shaped body 10 than is the first part 11 and that extends in an axial direction of the rod-shaped body 10 so as to surround the rod-shaped body 10. As illustrated in L2 of FIG. 2, the nonslip part 13 has a length w2 that is measured in a radial direction of the rod-shaped body 10 and is greater than a diameter w1 of the bottom plate-side hole 102a.

In addition, as illustrated in FIG. 1, a height h2 from the bottom plate 101 to an upper end of the rod-shaped body 10 as measured in a state in which the rod-shaped body 10 is inserted in the bottom plate-side hole 102a and in the cover-side hole 104a is preferably greater than a height h1 from the bottom plate 101 to an upper end of the silicon rod 110 that stands upright. In particular, the height h2 is preferably 200 mm to 500 mm greater than the height h1.

(Method for Detaching Cover)

The following description will discuss an example of a method for detaching the cover 103 from the bottom plate 101, together with which the cover 103 forms the reactor 100 in which the silicon rod 110 is contained upright.

First, the rod-shaped body 10 is inserted into the bottom plate-side hole 102a provided in the surrounding area of the bottom plate 101 and into the cover-side hole 104a provided in the surrounding area of the cover 103 so as to face the bottom plate-side hole 102a (an inserting step). In this inserting step, the rod-shaped body 10 is passed through the bottom plate-side hole 102a and the cover-side hole 104a while no nonslip part 13 is fitted to the rod-shaped body 10 at a position that is closer to the lower end of the rod-shaped body 10 than is the first part 11. The nonslip part 13 is fitted to the rod-shaped body 10 after the rod-shaped body 10 is passed through the bottom plate-side holes 102a and the cover-side holes 104a. Further, the rod-shaped body 10 that has been inserted into the surrounding area of the bottom plate 101 and into the surrounding area of the cover 103 in the inserting step includes two or more rod-shaped bodies 10 that are inserted at respective places at substantially regular intervals in the circumferential direction of the bottom plate 101 and of the cover 103. Typically six, preferably three, and particularly preferably two rod-shaped bodies 10 are to be inserted. For example, in a case where two rod-shaped bodies 10 are inserted, the rod-shaped bodies 10 are inserted in the bottom plate-side holes 102a located at respective both ends of the diameter of the reactor 100 and in the cover-side holes 104a located at respective both ends of the diameter of the reactor 100.

Next, the cover 103 is lifted upward (in the direction indicated by the arrow in FIG. 1) while the rod-shaped bodies 10 are inserted in the bottom plate-side holes 102a and in the cover-side holes 104a (lifting step).

The cover 103 that is being lifted unfortunately may laterally swing due to the weight of the silicon rods having fallen against an inner wall of the cover 103. Specifically, such a lateral swing of the cover 103 causes, for example, (1) a problem such that the cover 103 hits the silicon rod 110 that stands upright in the reactor 100, and the silicon rod 110 falls over accordingly, or (2) a problem such that the cover 103 hits a protective wall provided around the reactor 100, so that the cover 103 can no longer be lifted.

However, the cover 103 is lifted along the rod-shaped bodies 10 by being lifted while the rod-shaped bodies 10 are inserted in the bottom plate-side holes 102a and in the cover-side holes 104a. This makes it possible to substantially vertically lift the cover 103. Consequently, even in a case where the silicon rod 110 is in contact with an inner wall of the reactor 100, the cover 103 can be prevented from laterally swinging while being lifted, and can be lifted to a position higher than an upper end of the silicon rod 110 that stands upright on the bottom plate 101.

In a case where a method for manufacturing the silicon rod 110 includes the inserting step and the lifting step as the step of detaching the cover 103 which forms the reactor 100 together with the bottom plate 101, it is possible to achieve a method for manufacturing the silicon rod 110, the method bringing about the following effect. Specifically, it is possible to achieve a method for manufacturing the silicon rod 110, the method making it possible to, even in a case where the silicon rod 110 is in contact with the inner wall of the reactor 100, open the reactor 100 by lifting the cover 103.

(Design of Rod-Shaped Body)

The inventor has conducted various analyses of a rod-shaped body 10 and found that the lateral swing of the cover 103 which is being lifted can be optimally prevented by designing the rod-shaped body 10 on the basis of the following description.

Specifically, the rod-shaped body 10 desirably has a diameter that is 85% to 98%, preferably 90% to 95%, and particularly preferably 92% to 94% of the diameter of a bottom plate-side hole 102a and a cover-side hole 104a. When a ratio of the diameter of the rod-shaped body 10 to the diameter of the bottom plate-side hole 102a and the cover-side hole 104a is too large, the rod-shaped body 10 gets stuck in the bottom plate-side hole 102a and in the cover-side hole 104a. This makes it impossible to smoothly pass the rod-shaped body 10 through the bottom plate-side hole 102a and the cover-side hole 104a, and further makes it impossible to smoothly lift the cover 103. When the ratio of the diameter of the rod-shaped body 10 to the diameter of the bottom plate-side hole 102a and the cover-side hole 104a is too small, the cover 103 swings laterally in a range equal to or greater than an allowable range and, moreover, the rod-shaped body 10 decreases in strength.

The rod-shaped body 10 can have a diameter that is not limited to the above diameter and is not limited to any particular dimeter, provided that a lower surface of the cover flange 104 laterally swings in a range of −100 mm to +100 mm, preferably −70 mm to +70 mm, and particularly preferably −40 mm to +40 mm, relative to an upper surface of the bottom plate flange 102. In the reactor 100 in which several tens of silicon core wires are set upright on the bottom plate 101 so that several tens of silicon rods 110 are grown, many silicon core wires are set upright on many concentric circles so as to be grown. A silicon rod 110 into which a silicon core wire standing on a circumference of one of the concentric circles which one is the closest to the cover 103 has grown so as to have a diameter of 100 mm to 200 mm is at a distance of typically approximately several hundred millimeters from the inner wall of the cover 103. In view of this, the cover 103 is required to laterally swing in the range of −100 mm to +100 mm so that the cover 103 will not come into contact with the silicon rod 110.

Further, in considering bending of the rod-shaped body 10, the rod-shaped body 10 desirably has a diameter of 10 mm to 50 mm, preferably 15 mm to 45 mm, and particularly preferably 20 mm to 40 mm. The rod-shaped body 10 that has a diameter of less than 10 mm greatly bends, so that the cover 103 laterally swings more widely while being lifted. The rod-shaped body 10 that has a diameter of more than 50 mm becomes heavier. This results in lower workability. The rod-shaped body 10 can have a length that is not limited to any particular length, provided that the length makes it possible to lift the cover 103 to a position higher than the upper end of the silicon rod 110 that has grown in the reactor 100. As described earlier, the height h2 from the bottom plate 101 to the upper end of the rod-shaped body 10 is preferably 200 mm to 500 mm greater than the height h1 from the bottom plate 101 to the upper end of the silicon rod 110 that stands upright from the bottom plate 101. The rod-shaped body 10 typically has a length of 500 mm to 3000 mm.

(Variation 1)

Figure 3:
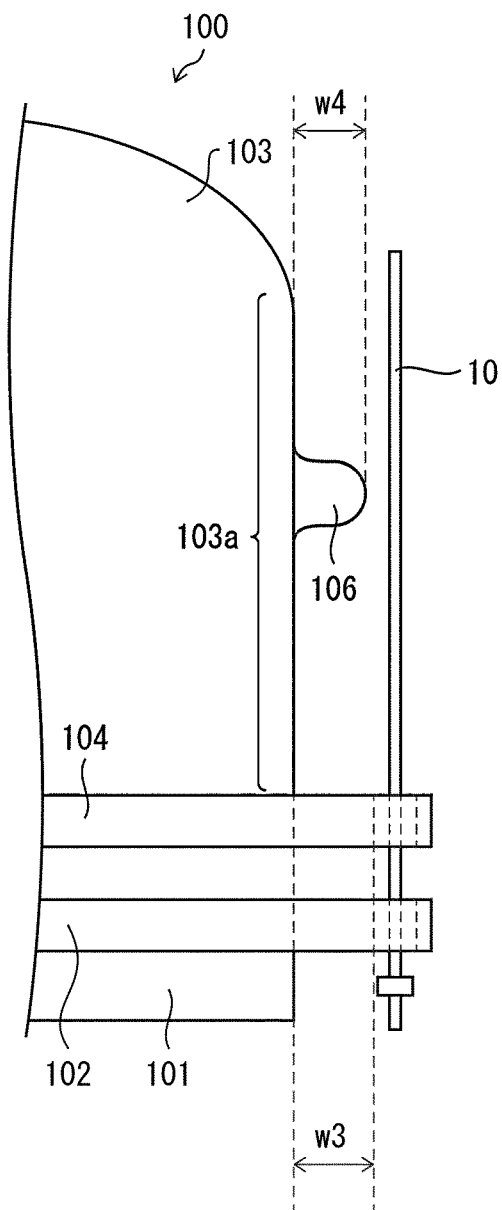
FIG. 3 is a side view illustrating the reactor having a projection.
Figure 4:
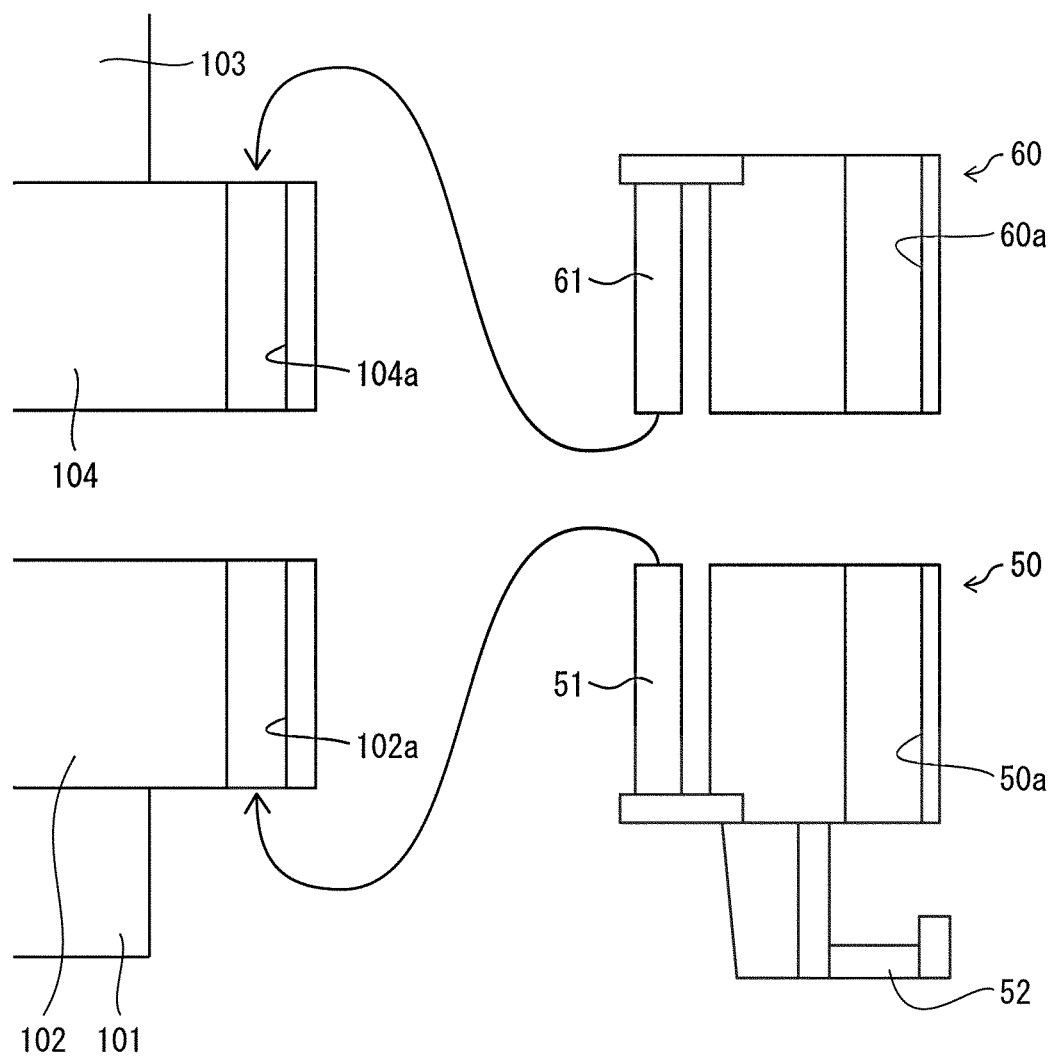
FIG. 4 is a cross-sectional view describing Variation 1 of the embodiment of the present invention and schematically illustrating configurations of jigs of the rod-shaped body.

The following description will discuss Variation 1 of the present invention with reference to FIGS. 3 and 4. FIG. 3 is a side view illustrating the reactor 100 having a projection 106. FIG. 4 is a cross-sectional view describing Variation 1 of the present invention and schematically illustrating configurations of jigs 50 and 60 of the rod-shaped body 10.

The cover 103 of the reactor 100 can have various shapes. For example, the cover 103 may have the projection 106 provided on a side-wall surface 103a (an outer wall) of the cover 103 (see FIG. 3). The projection 106 serves as, for example, a projecting structure such as a nozzle and an inspection manhole.

Even in a case where the projection 106 is provided on the cover 103, there is no problem provided that a distance w3 is longer than a distance w4 as illustrated in FIG. 3. The distance w3 is a distance from an outer edge of the bottom plate 101 to the bottom plate-side hole 102*a*, and is also a distance from the outer wall of the cover 103 to the cover-side hole 104*a*. The distance w4 is a distance from the outer wall of the cover 103 to an end of the projection 106 provided on the outer wall of the cover 103, the end facing away from the outer wall of the cover 103.

However, in a case where the distance w3 is shorter than the distance w4 and the rod-shaped body 10 is to be passed through the bottom plate-side hole 102*a* provided in the bottom plate flange 102 and through the cover-side hole 104*a* provided in the cover flange 104, the rod-shaped body 10 bumps against the projection 106 depending on where the projection 106 is provided. In that case, it is impossible to insert the rod-shaped body 10 into the bottom plate-side hole 102*a* and into the cover-side hole 104*a*. This makes it impossible to vertically lift the cover 103. For this reason, the jigs 50 and 60 are used in a case where the projection 106 is provided on the cover 103 and the distance w3 is shorter than the distance w4.

As illustrated in FIG. 4, in order to provide, in the surrounding area of the bottom plate 101, the bottom plate-side hole 102*a* into which the rod-shaped body 10 is to be inserted, the jig 50 includes an attachment part 51 to be attached in the surrounding area of the bottom plate 101, and has a hole 50*a* formed therein that serves as the bottom plate-side hole 102*a*. The jig 50 also includes a supporting part 52, provided in a lower part of the jig 50, for supporting a lower end part of the rod-shaped body 10. In using the jig 50, the jig 50 is fitted to the bottom plate flange 102 by inserting, from below, the attachment part 51 into the bottom plate-side hole 102*a* formed in the bottom plate flange 102, and the first part 11 of the rod-shaped body 10 is inserted in the hole 50*a* serving as the bottom plate-side hole 102*a*.

Figure 5:
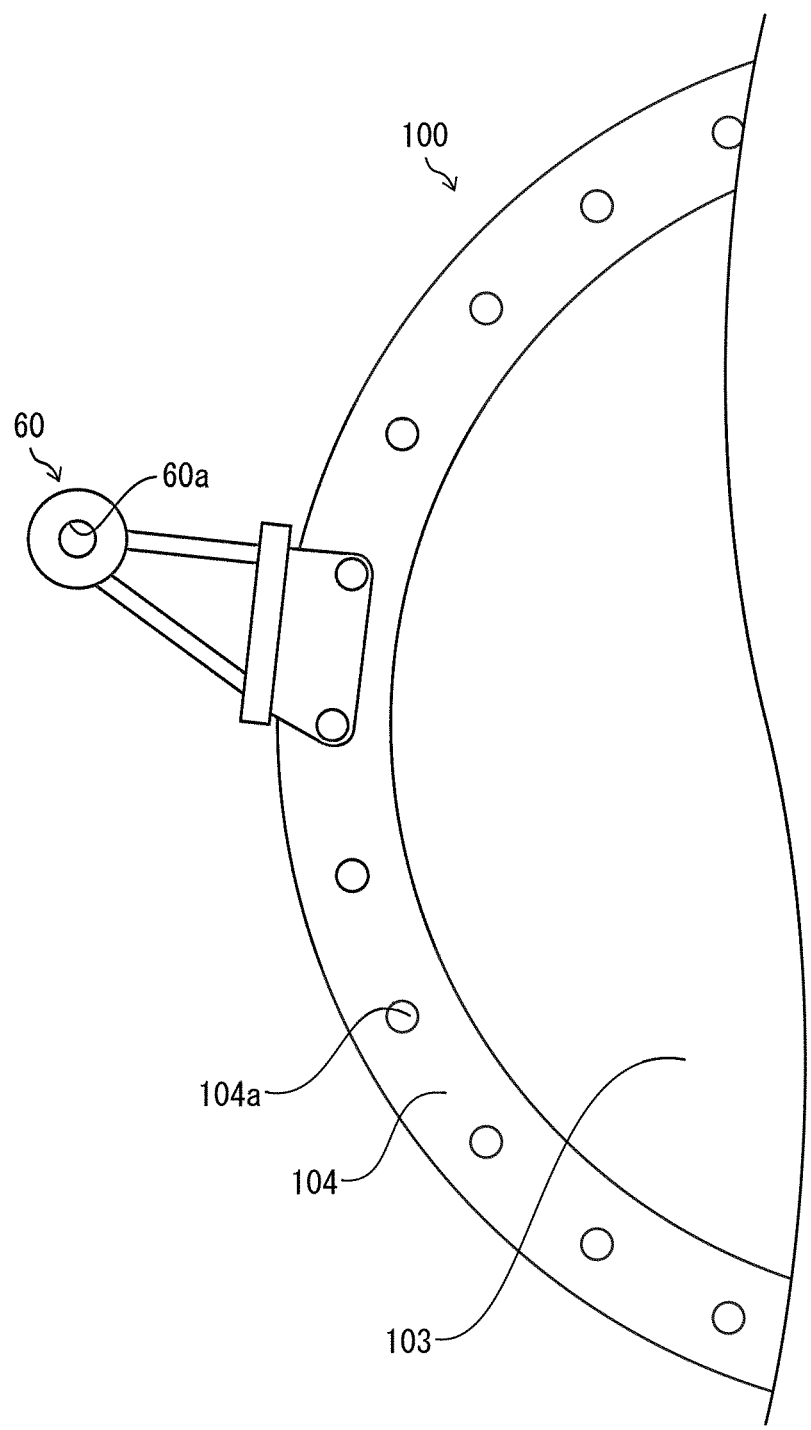
FIG. 5 is a partial top view of the reactor illustrating a state in which the jig has been fitted to the cover of the reactor.

In order to provide, in the surrounding area of the cover 103, the cover-side hole 104*a* into which the rod-shaped body 10 is to be inserted, the jig 60 includes an attachment part 61 to be attached in the surrounding area of the cover 103, and has a hole 60*a* formed therein that serves as the cover-side hole 104*a*. In using the jig 60, the jig 60 is fitted to the cover flange 104 by inserting, from above, the attachment part 61 into the cover-side hole 104*a* formed in the cover flange 104, and the second part 12 of the rod-shaped body 10 is inserted into the hole 60*a* serving as the cover-side hole 104*a*. FIG. 5 illustrates an example of how the jig 60 has been fitted. FIG. 5 is a partial top view of the reactor 100 and illustrates a state in which the jig 60 has been fitted to the cover flange 104 of the reactor 100.

When the jigs 50 and 60 are used, a distance from the outer edge of the bottom plate 101 to the hole 50*a* serving as the bottom plate-side hole 102*a* and a distance from the outer wall of the cover 103 to the hole 60*a* serving as the cover-side hole 104*a* are each longer than a distance from the outer wall of the cover 103 to an end of the projection 106 provided on the outer wall of the cover 103, the end facing away from the outer wall of the cover 103. Thus, in a case where the jigs 50 and 60 are used, the rod-shaped body 10 can be disposed so as not to bump against the projection 106 and so as to be substantially parallel to the side-wall surface 103*a* of the cover 103 and substantially vertically extend. This makes it possible to lift the cover 103 above the upper end of the silicon rod 110.

Note that a ratio of the diameter of the rod-shaped body 10 to the diameter of the hole 50*a* serving as the bottom plate-side hole 102*a* and the hole 60*a* serving as the cover-side hole 104*a* is designed so as to be similar to a ratio of the diameter of the rod-shaped body 10 to the diameter of the bottom plate-side hole 102*a* and the cover-side hole 104*a*.

(Variation 2)

Figure 6:
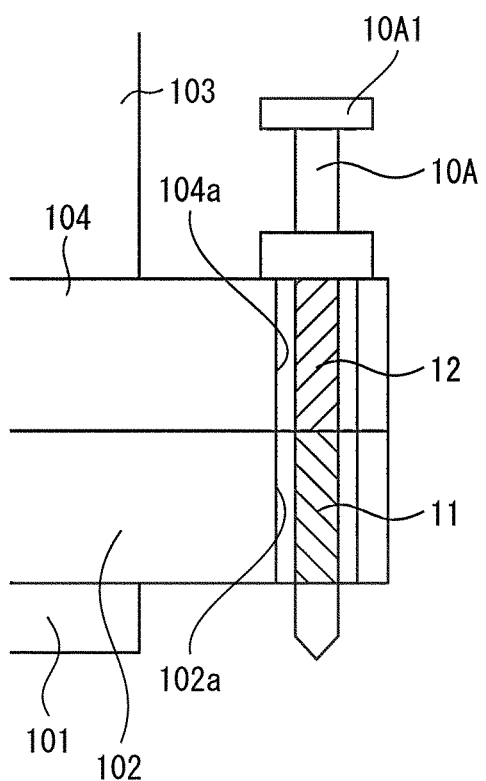
FIG. 6 is a cross-sectional view describing Variation 2 of an embodiment of the present invention and illustrating a variation of the rod-shaped body.

The following description will discuss Variation 2 of the present invention with reference to FIG. 6. FIG. 6 is a cross-sectional view describing Variation 2 of an embodiment of the present invention and illustrating a state in which a rod-shaped body 10A, which is a variation of the rod-shaped body 10, is inserted in the bottom plate-side hole 102*a* and in the cover-side hole 104*a*.

In the step of lifting the cover 103, it is possible to use the rod-shaped body 10 whose length and thickness are changed depending on a lifted state of the cover 103. Specifically, it is possible to prepare a shorter rod-shaped body (the rod-shaped body 10A) having a shorter length than a longer rod-shaped body (the rod-shaped body 10) that has been described with reference to FIG. 1 and designed such that the height h2 from the bottom plate 101 to the upper end of the rod-shaped body 10 is greater than the height h1 from the bottom plate 101 to the upper end of the silicon rod 110 standing upright. One of the shorter and longer rod-shaped bodies can be selectively used, or both the shorter and longer rod-shaped bodies can be simultaneously used.

More specifically, while the bolts that fix the bottom plate flange 102 and the cover flange 104 are being removed so that the cover 103 is detached from the bottom plate 101, the bottom plate 101 and the cover 103 are more likely to be positionally displaced from each other in the reactor 100. Further, the bottom plate flange 102 and the cover flange 104 may partially strongly adhere to each other during the detachment of the cover 103 from the bottom plate 101. In such a case, it may be necessary to apply a heavy load in order to separate the cover flange 104 from the bottom plate flange 102. In addition, at the beginning of the lifting of the cover 103, a load caused by the swing is particularly high. For these reasons, it is necessary to particularly increase positional stability of the cover 103 during a period from the detachment of the bolts to the beginning of the lifting of the cover 103. This leads to a desirable aspect in which such a shorter rod-shaped body 10A and the longer rod-shaped body are selectively used, or simultaneously used.

The rod-shaped body 10A is desirably thick and short. Specifically, the rod-shaped body 10A has a length of, for example, 300 mm to 400 mm. The rod-shaped body 10A desirably has a diameter in a range of 92% to 97%, which is the particularly preferable range among the above-described ranges of the diameter relative to the diameter of the bottom plate-side hole 102*a* and the cover-side hole 104*a*. The diameter of the rod-shaped body 10A is desirably 20 mm to 30 mm in actual size. The rod-shaped body 10A is provided with a handle 10A1 which is closer to an upper end of the rod-shaped body 10A than is the second part 12 and which extends in an axial direction of the rod-shaped body 10A so as to surround the rod-shaped body 10A (see FIG. 6). The rod-shaped body 10A is used to increase the positional stability during the period from the detachment of the bolts to the beginning of the lifting of the cover 103. This eliminates the need to necessarily provide the nonslip part 13, which is provided so as to be closer to the lower end of the rod-shaped body 10 than is the first part 11. Further, in order to carry out an operation while the cover 103 is being lifted approximately one meter, it is possible to use a longer rod-shaped body (not illustrated) than the rod-shaped body 10A.

(Protective Structure)

Figure 7:
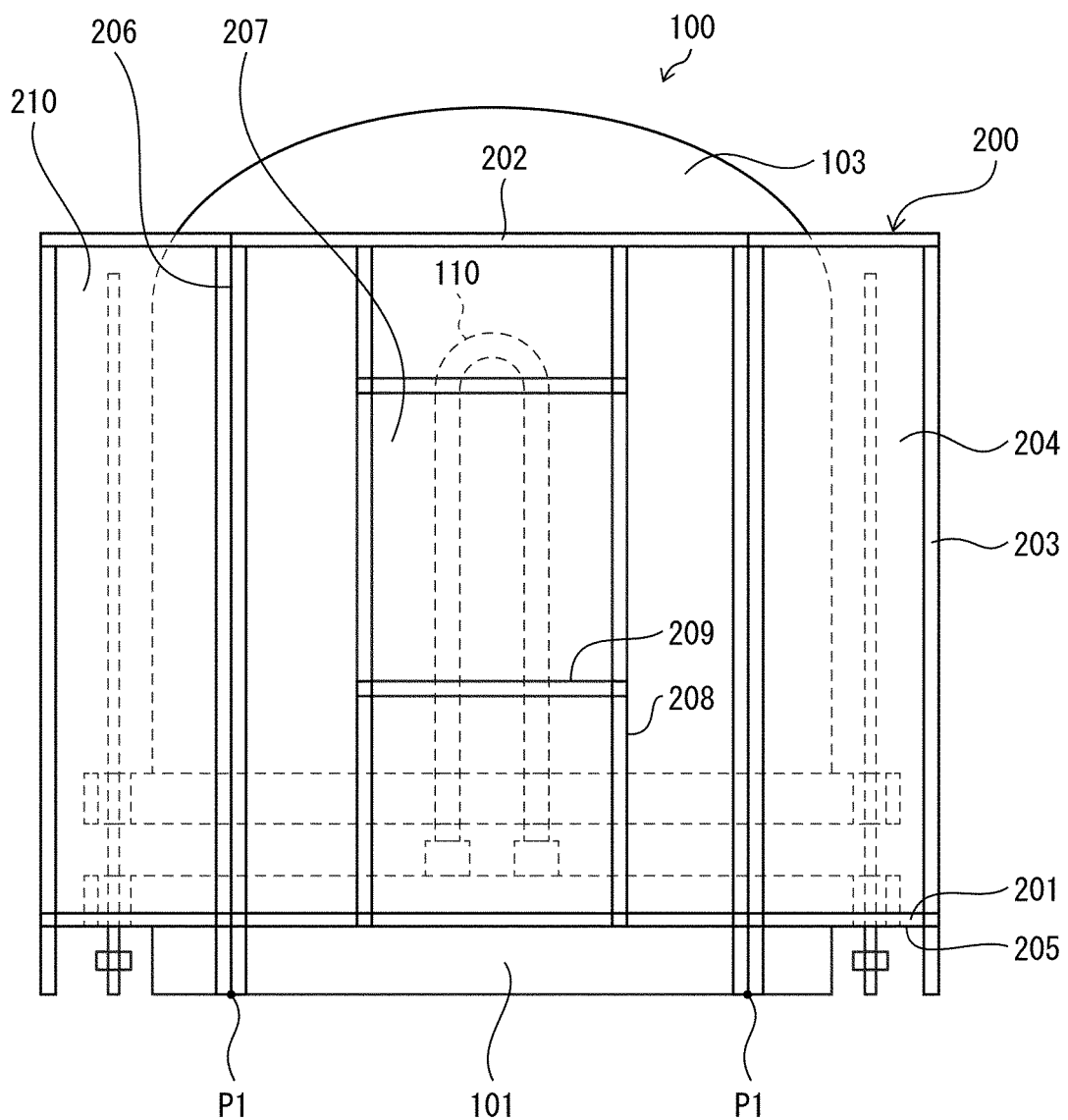
FIG. 7 is a side view illustrating how the cover of the reactor is detached from the bottom plate of the reactor while a protective structure in accordance with an embodiment of the present invention is provided around the reactor.
Figure 8:
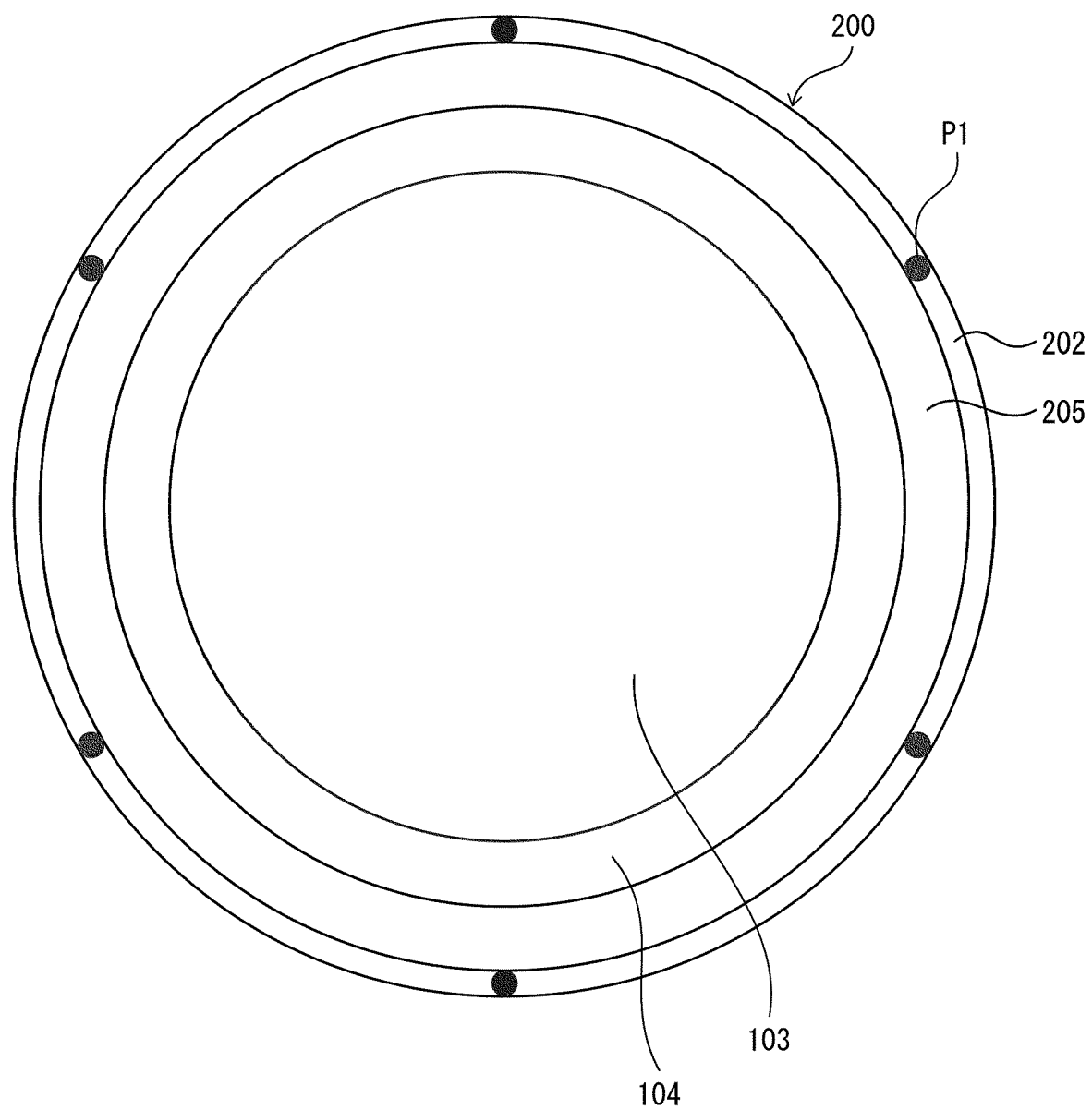
FIG. 8 is a top view of the protective structure.
Figure 9:
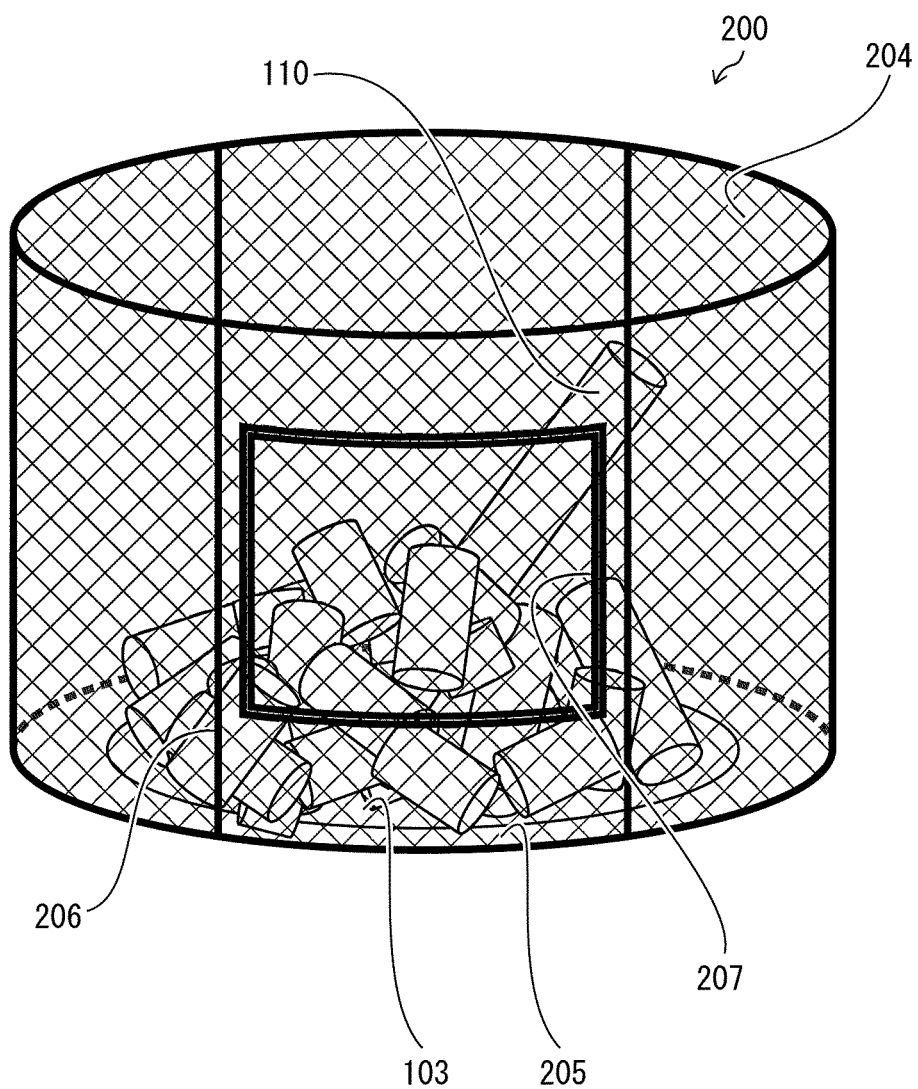
FIG. 9 is a view for describing the protective structure, the view schematically illustrating a state in which the cover has been detached from the reactor illustrated in FIG. 7.
Figure 10:
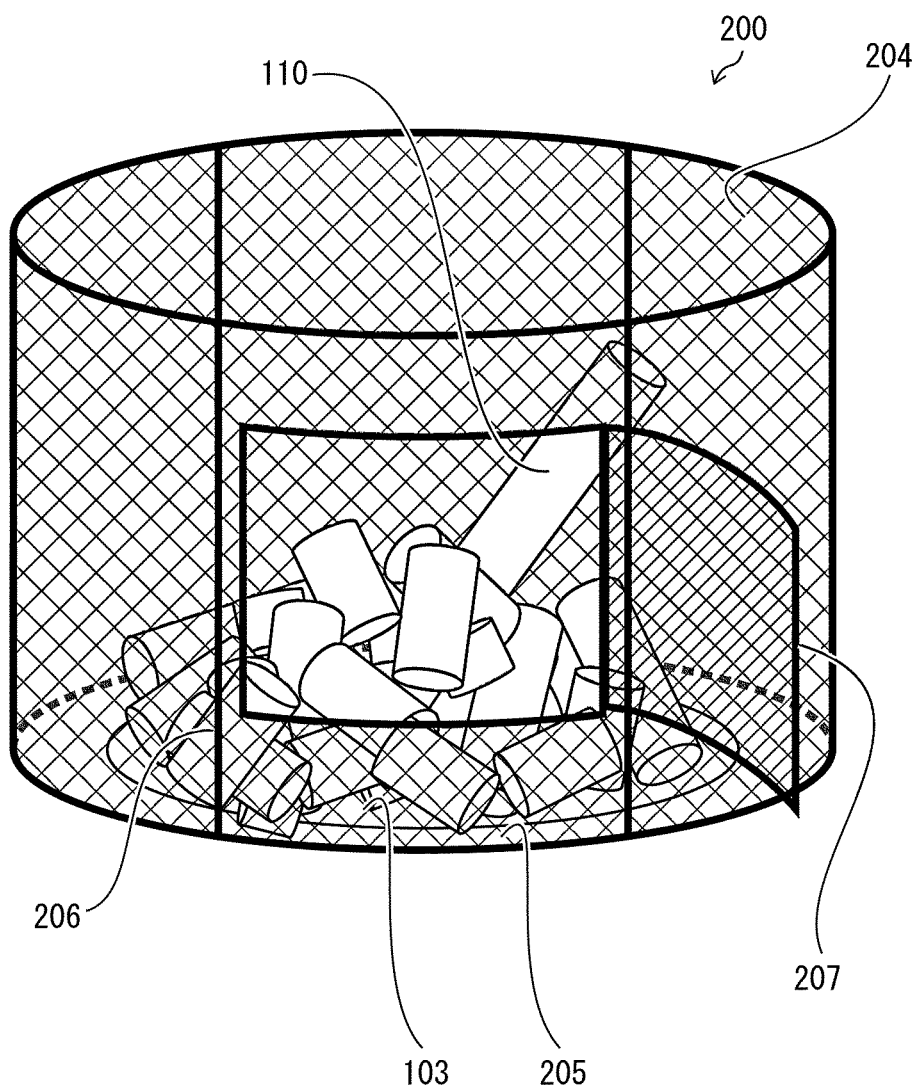
FIG. 10 is a view for describing the protective structure, the view schematically illustrating a state in which a takeout window is open in FIG. 9.
Figure 11:
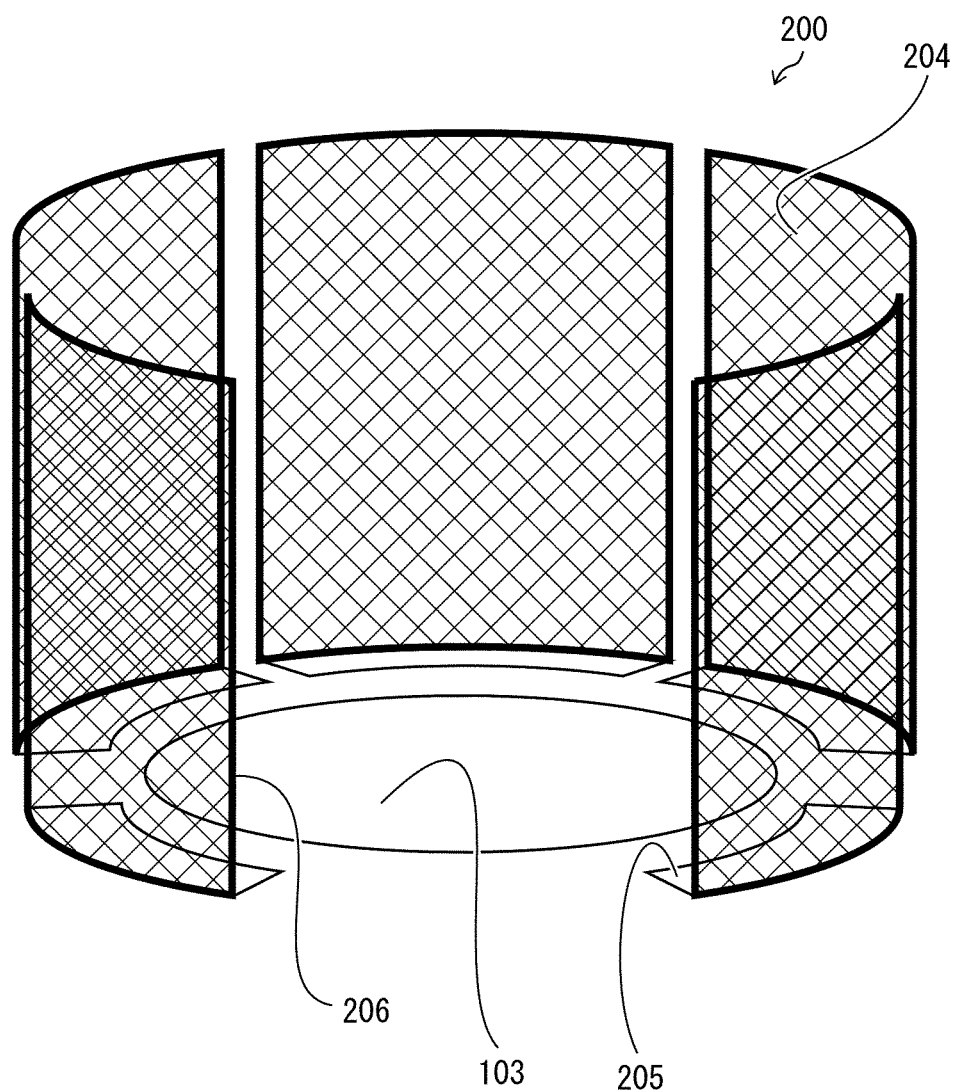
FIG. 11 is a view for describing the protective structure, the view illustrating a state in which the protective structure has been divided.

The following description will discuss a protective structure 200 with reference to FIG. 7 to FIG. 11. FIG. 7 is a side view illustrating how the cover 103 of the reactor 100 is detached from the bottom plate 101 of the reactor 100 while the protective structure 200 in accordance with an embodiment of the present invention is provided around the reactor 100. FIG. 8 is a top view of the protective structure 200. FIG. 9 is a view for describing the protective structure 200, the view schematically illustrating a state in which the cover 103 has been detached from the reactor 100 illustrated in FIG. 7. FIG. 10 is a view for describing the protective structure 200, the view schematically illustrating a state in which a takeout window 207 of the protective structure 200 is open in FIG. 9. FIG. 11 is a view for describing the protective structure 200, the view illustrating a state in which the protective structure 200 has been divided. For simplification, FIGS. 9 to 11 do not illustrate components of the protective structure 200 which are different from a protective wall surface 204, a protective plate 205, dividing lines 206, and the takeout window 207.

The protective structure 200 is a structure for preventing, during the detachment of the cover 103 from the bottom plate 101, silicon rods 110 standing upright on the bottom plate 101 from falling over outside the bottom plate 101 and being scattered over a floor. The protective structure 200 is provided around the reactor 100. It is possible to provide the protective structure 200 around the reactor 100 in order to only lift the cover 103 against which the silicon rods 110 have fallen. The protective structure 200 includes a first frame body 201 (frame body), a second frame body 202, a plurality of third frame bodies 203, and a protective wall surface 204 (see FIGS. 7 and 8).

The first frame body 201 is shaped so as to surround the bottom plate 101 of the reactor 100 in which the silicon rods 110 are contained. The first frame body 201 is connected to the plurality of third frame bodies 203 extending vertically. The first frame body 201 is supported by the plurality of third frame bodies 203 at a position at which the first frame body 201 surrounds the bottom plate 101.

The second frame body 202 extends horizontally and is connected to upper ends of the plurality of third frame bodies 203. The second frame body 202 is supported by the plurality of third frame bodies 203 so as to extend horizontally. Each of the plurality of third frame bodies 203 is connected to the first frame body 201 and the second frame body 202, and supports the first frame body 201 and the second frame body 202.

The protective wall surface 204 extends vertically upward from the first frame body 201 and forms a storage space 210 for the silicon rods 110. The protective wall surface 204 has a mesh structure.

The protective structure 200 includes the protective plate 205 having a ring shape and provided between the first frame body 201 and the bottom plate 101 of the reactor 100. The protective plate 205 has a flat surface that extends so as to surround the bottom plate 101 and that spreads horizontally. The protective plate 205 is provided, for example, so as to be level with a lower surface of the bottom plate flange 102 of the reactor 100. Since the protective plate 205 is thus provided between the bottom plate 101 and the first frame body 201, the silicon rod 110 that has fallen over are scattered on the protective plate 205. This allows the protective structure 200 for the silicon rods 110 to, even in a case where the cover 103 of the reactor 100 has been detached, prevent the silicon rod 110 from being scattering over the floor (see FIG. 9).

The protective wall surface 204 includes a takeout window 207 formed therein for taking out the silicon rods 110 that are contained in the reactor 100. The takeout window 207 is formed by being surrounded by two fourth frame bodies 208 and two fifth frame bodies 209. The fourth frame bodies 208 extend vertically and are provided between the first frame body 201 and the second frame body 202. The fifth frame bodies 209 extend horizontally and are provided between the two fourth frame bodies 208. By thus forming the takeout window 207 in the protective wall surface 204, it is possible to open the takeout window 207 so as to take out the silicon rods 110 through the takeout window 207 while the protective structure 200 for the silicon rods 110 is provided without being disassembled (see FIG. 10).

The protective structure 200 can be divided along dividing lines 206 each extending vertically upward from a corresponding one of a plurality of points P1 on the first frame body 201. That is, the protective structure 200 as illustrated in FIG. 8 can be divided into six parts (see FIG. 11). This makes it possible to efficiently assemble the protective structure 200 by, for example, dividing the protective structure 200 for the silicon rods 110 into parts having sizes suitable for transportation and storage of the silicon rods 110.

The above configuration allows the protective wall surface 204 to have a mesh structure in the protective structure 200 for the silicon rods 110, the protective wall surface 204 extending vertically upward from the first frame body 201 and forming the storage space for the silicon rods 110. Thus, according to the protective structure 200 for the silicon rods 110, it is possible to achieve visibility from outside to inside the protective structure 200 while preventing the silicon rods 110 from being scattered outside the protective structure 200 for the silicon rods 110. As a result, the protective structure 200 for the silicon rods 110 makes it possible to, for example, while checking how the silicon rods 110 have fallen over, carry out an operation to lift the cover 103 of the reactor 100.

(Design of Protective Structure)

The silicon rods 110, each of which is several meters high and weighs several tens of kilograms, are easily broken even by a small impact. Due to an impact caused when the silicon rods 110 begin to fall toward the outside of the reactor 100 during the lifting of the cover 103 or an impact caused when the silicon rods fall over, the silicon rod 110 are broken into pieces of silicon in massive or powdery form that are widely distributed in terms of size. Almost all of these pieces of silicon need to be captured.

The inventor has conducted various analyses and found that by lifting the cover 103 while the protective structure 200 that meets design requirements described below is provided around the reactor 100, it is possible to cause the protective structure 200 to receive (i) the silicon rods 110 having fallen over and (ii) pieces into which the silicon rods 110 have been broken.

(Design of Protective Wall Surface)

The silicon rods 110 that have grown typically have a U-shape and have a length of four meters to six meters in terms of a linear length and have a thickness of 100 mm to 200 mm. Assuming that the specific gravity of silicon is 2.4 g/cm$^3$, a single silicon rod 110 has a weight of 75 kg to 460 kg, and the silicon rods 110 have a total weight of 1300 kg to 8200 kg in the reactor 100 for 18 U-shaped rods. Thus, the protective structure 200 that does not have a sufficient strength may cause the silicon rods 110 and fragments produced when the silicon rods 110 are broken to crash through the protective structure 200 and may harm a worker who carries out an operation to open the reactor.

Note here that as a result of observation of a manner in which the silicon rods 110 start to fall over, the inventor has found that the silicon rods 110 are scattered inside the protective structure 200 in the following manner. Specifically, each of the silicon rods 110 (1) slowly falls toward the outside of the reactor 100 from joints between a silicon rod 110 and corresponding electrodes 105, (2) slowly leans against the protective structure 200 and remains in a rod form or is broken up due to an impact caused by its falling against the protective structure 200, and (3) is divided into silicon blocks and/or silicon pieces and is scattered inside the protective structure 200.

The above manner shows that a static pressure applied on a point A (not illustrated) in an inner surface of the protective pressure 200 when all the silicon rods 110 on the reactor 100 lean against the protective structure 200 depends on a distance L between the bottom plate flange 102 and the protective structure 200 and a weight W of all of the silicon rods 110 inside the reactor 100. That is, the magnitude of the static pressure can be estimated by setting respective values of the distance L and the weight W. For example, in a case where the protective wall surface 204 of the protective structure 200 is placed within 1 m from an outer diameter of the bottom plate flange 102 of the reactor 100, the static pressure that is applied to the protective wall surface 204 of the protective structure 200 is lower than or equal to half the total weight of the silicon rods 110.

(Mesh of Protective Wall Surface)

In terms of achievement of higher work efficiency, the protective wall surface 204 is preferably made of metal and preferably has a mesh structure. This is because the protective wall surface 204 that is lighter further facilitates an operation to place the protective wall surface 204. In order to make the protective structure 200 lighter, it is desirable to set a mesh size of the protective wall surface 204 as below. Specifically, a test of breaking up the silicon rods 110 that have grown is carried out, a size distribution of silicon pieces produced due to the breakup of the silicon rods 110 is found, and a mesh size that enables not less than 99% of the silicon pieces to be captured is set as the mesh size of the protective wall surface 204. The protective wall surface 204 that has a too small mesh size causes the inside of the protective structure 200 to be less visible from the outside of the protective structure 200. Specifically, the protective wall surface 204 desirably has an optimal mesh size of 2 Tyler mesh to 10 Tyler mesh, preferably 3 Tyler mesh to 7 Tyler mesh, and particularly preferably 3 Tyler mesh to 5 Tyler mesh.

Further, it is desirable to determine the gauge of a wire mesh gauze of the protective structure 200 on the basis of the static pressure described above. Specifically, the wire gauze of the protective wall surface 204 desirably has 16 gauge to 20 gauge, preferably 17 gauge to 19 gauge, and particularly preferably 18 gauge. This configuration makes it possible to accept the static pressure caused by the fall of the silicon rods 110.

(Design of Division)

It is determined only through an inspection window (not illustrated) provided in the side-wall surface 103a of the cover 103 or through a space created by slightly lifting the cover 103 whether the silicon rods 110 obtained through deposition have fallen against the inner wall of the cover 103. Thus, in a case where it is determined that the silicon rods 110 have fallen against the inner wall of the cover 103, it is necessary to stop lifting the cover 103 and to quickly assemble the protective structure 200. This requires an operation to assemble the protective structure 200 to be quickly carried out.

The protective structure 200 that is structured to be divided makes even lighter individual parts into which the protective structure 200 is divided and facilitates an operation to place the protective structure 200. In a case where the protective structure 200 is structured to be divided so as to be more mobile, the number of parts into which the protective structure 200 is divided is desirably selected on the basis of weights that allow manual transportation. Specifically, the number of the parts into which the protective structure 200 is divided is desirably determined such that each of the parts into which the protective structure 200 is divided has a weight of 80 kg to 180 kg, preferably 100 kg to 160 kg, and particularly preferably 120 kg to 150 kg.

The following description will discuss an example of assembly of the protective structure 200 that is structured to be divided. The parts into which the protective structure 200 is divided are placed in close contact with each other so as to surround the reactor 100 in the form of a ring. Then, joints of adjacent ones of the parts into which the protective structure 200 is divided are fixed by quick coupling so that the protective structure 200 into which the parts are integrated is assembled.

(Design of First Frame Body)

The first frame body 201 of the protective structure 200 forms a circle which can have any diameter provided that the diameter is larger than the outer diameter of the bottom plate flange 102 and the cover flange 104 of the reactor 100. Specifically, the circle formed by the first frame body 201 desirably has a diameter that is 0 mm to 1000 mm, preferably by 200 mm to 700 mm, and particularly preferably by 300 mm to 600 mm larger than the outer diameter of the bottom plate flange 102 and the cover flange 104. This makes it possible to smoothly lift the cover 103 inside the protective structure 200 and to allow a lower static pressure to be applied to the protective wall surface 204 by the silicon rods 110 having fallen against the protective wall surface 204.

The silicon rods 110 that have been broken up due to an impact of their falling against the protective structure 200 are divided into silicon blocks and/or silicon pieces, and are scattered inside the protective structure 200. The inventor has found that some silicon blocks and/or silicon pieces jump over the protective structure 200 depending on the particle diameter of the silicon pieces produced or the height of the protective structure 200.

Under the circumstances, the inventor measured a size distribution of silicon blocks and/or silicon pieces each produced due to an impact of collapse of the silicon rods 110. Results of the measurement have turned out that silicon pieces which are produced in a case where the silicon rods 110 having a length of several meters and having a diameter of 100 mm to 200 mm are collapsed and broken have a minimum size of not less than approximately 10 mm. In order to receive all the silicon rods 110 that are thus scattered, it is desirable to design the first frame body 201 such that a distance from the inner surface of the protective structure 200 to the outer surface of the reactor 100 is 500 mm, preferably 300 mm, and particularly preferably 250 mm.

(Height of Protective Structure)

The protective structure 200 can have any height provided that the height is greater than a height H (not illustrated) from a floor of a reactor chamber in which the reactor 100 is placed to upper ends of the silicon rods 110 that stand upright on the bottom plate 101 without being collapsed. The protective structure 200 that has a height much greater than the height H is not preferable. This is because the protective structure 200 thus configured makes it necessary to lift the silicon rods 110 too high in order to take out the silicon rods 110 inside the protective structure 200 by moving the silicon rods 110 above the protective structure 200. This makes workability worse.

In contrast, the protective structure 200 that has a height much smaller than the height H makes it impossible to, when the silicon rods 110 fall over toward the outside the reactor 100, prevent silicon pieces that are produced due to collapse of the silicon rods 110 from jumping over the protective structure 200. The protective structure 200 therefore desirably has a height that is −200 mm to 800 mm, preferably 0 mm to 500 mm, and particularly preferably 0 mm to 200 mm greater than the height H.

(Method for Evaluating Distribution of Silicon Pieces)

The distribution of silicon pieces produced due to the breakup of the silicon rods 110 was evaluated as below. The silicon rods 110 that were not collapsed in the reactor and then successfully taken out of the reactor 100 were set upright on a flat floor. These silicon rods 110 were caused to fall from lower ends of the silicon rods 110. Silicon pieces produced due to such collapse of the silicon rods 110 as described above were subjected to a measurement of the weight distribution of sizes thereof. In order that the silicon rods 110 having fallen over would not directly contact a surface of the floor, other silicon rods 110 different from the silicon rods 110 to be caused to fall on the flat floor were caused to lie sideway and densely placed so as to surround the silicon rods 110 to be caused to fall.

(Method for Manufacturing Silicon Rod with Use of Protective Structure)

The following description will discuss an example of a method for manufacturing a silicon rod with use of the protective structure 200. First, the bottom plate flange 102 and the cover flange 104 of the reactor 100 are unbolted after deposition of the silicon rods 110 is ended. Subsequently, the rod-shaped body 10 is inserted into the bottom plate-side hole 102a provided in the surrounding area of the bottom plate 101 and into the cover-side hole 104a provided in the surrounding area of the cover 103 so as to face the bottom plate-side hole 102a.

Next, it is checked whether the silicon rods 110 have fallen against the inner wall of the cover 103. In a case where the silicon rods 110 have fallen against the inner wall of the cover 103, the protective structure 200 is provided around the reactor 100 so that the storage space 210 for the silicon rods 110 is formed. The protective structure 200 includes the first frame body 201 that is shaped so as to surround the bottom plate 101 and the protective wall surface 204 that extends vertically upward from the first frame body 201 and that has a mesh structure. Subsequently, the cover 103 is lifted upward while the rod-shaped body 10 is inserted in the bottom plate-side hole 102a and in the cover-side hole 104a.

With the configuration, in order to lift the cover 103 having an inner wall against which the silicon rods 110 have fallen, it is possible to lift the cover 103 substantially without causing the cover 103 to laterally swing. It is therefore possible to prevent snagging of the cover 103 on the protective structure 200 due to the lateral swing. Thus, even in a case where the silicon rods 110 have fallen against the inner wall of the cover 103, an operation to lift the cover 103 can be carried out while the protective structure 200 is provided around the reactor 100. As a result, the operation to lift the cover 103 can be carried out while the silicon rods 110 are prevented from being scattered outside the protective structure 200.

Since it is possible to lift the cover 103 substantially without causing the cover 103 to laterally swing, it is possible to prevent the silicon rods 110 inside the bottom plate 101 from falling like dominos. Furthermore, without a reduction in yield of the silicon rods 110, it is possible to prevent silicon pieces produced due to the breakup of the silicon rods 110 from being scattered on the floor of the reaction chamber. This avoids a risk to a worker who carries out an operation to open the cover 103. Furthermore, the operation to open the cover 103 can be finished in a short time, and a subsequent deposition reaction can be immediately carried out. This enhances productivity.

Aspects of the present invention can also be expressed as follows:

A protective structure for a silicon rod in accordance with an aspect of the present invention includes a frame body that is shaped so as to surround a bottom plate of a reactor in which a silicon rod is contained; and a protective wall surface that extends vertically upward from the frame body and that forms a storage space for the silicon rod, the protective wall surface having a mesh structure.

According to this configuration, the protective structure for a silicon rod includes a protective wall surface that has a mesh structure, the protective wall surface extending vertically upward from the frame body and forming a storage space for the silicon rods. The protective structure for the silicon rods therefore makes it possible to achieve visibility from outside to inside the protective structure while preventing the silicon rods from being scattered outside the protective structure for the silicon rods. As a result, the protective structure for the silicon rods makes it possible to, for example, while checking how the silicon rods have fallen over, lift a cover of the reactor.

The protective structure for a silicon rod can include a protective plate which is provided between the frame body and the bottom plate of the reactor, and which has a flat surface that extends so as to surround the bottom plate and that spreads horizontally.

According to this configuration, due to a protective plate provided between the bottom plate of the reactor and the frame body, the silicon rods that have fallen over are scattered on the protective plate. Accordingly, the protective structure for the silicon rods makes it possible to prevent the silicon rods from being scattered on the floor.

The protective wall surface can be capable of being divided along dividing lines extending vertically upward from respective points on the frame body.

This configuration makes it possible to divide the protective structure for the silicon rods along the dividing lines. This makes it possible to provide the protective structure for the silicon rods, the protective structure that can be efficiently assembled by, for example, dividing the protective structure for the silicon rods into parts having sizes suitable for transportation and storage of the silicon rods.

According to the protective structure for a silicon rod, the protective wall surface can include a takeout window formed therein for taking out the silicon rod that is contained in the reactor.

This configuration makes it possible to take out the silicon rods through the takeout window while the protective structure for the silicon rods is provided without being disassembled.

A method for manufacturing a silicon rod, in accordance with an aspect of the present invention, includes a detaching step of detaching a cover from a bottom plate, together with which the cover forms a reactor in which the silicon rod is contained, the detaching step being carried out after a storage space of the silicon rod is formed by placing a protective structure including: a frame body that is shaped so as to surround the bottom plate; and a protective wall surface that extends vertically upward from the frame body and that has a mesh structure.

According to this configuration, the detaching step in the method for manufacturing a silicon rod is carried out after a protective structure is placed so that a storage space for the silicon rods is formed, the protective structure including a frame body that is shaped so as to surround the bottom plate and a protective wall surface that extends vertically upward from the frame body and that has a mesh structure. This prevents the silicon rods from being scattered outside the protective structure for the silicon rods in the detaching step. It is therefore possible to detach the cover of the reactor while checking how the silicon rods have fallen over.

The present invention is not limited to the embodiments above, but can be altered in various ways by a skilled person within the scope of the claims. The present invention encompasses, in its technical scope, any embodiment derived by combining technical means disclosed in differing embodiments.

REFERENCE SIGNS LIST 10, 10A: Rod-shaped body
11: First part
12: Second part
50, 60: Jig
51, 61: Attachment part
100: Reactor
101: Bottom plate
102: Bottom plate flange
102a: Bottom plate-side hole
103: Cover
103a: Side-wall surface (outer wall)
104: Cover flange
104a: Cover-side hole
105: Electrode
106: Projection
110: Silicon rod
200: Protective structure
201: First frame body (frame body)
204: Protective wall surface
205: Protective plate
206: Dividing line
207: Takeout window
210: Storage space

The invention claimed is:

1. A protective structure for a silicon rod, the protective structure comprising:
    a frame body that is shaped so as to surround a bottom plate of a reactor in which the silicon rod is contained; and
    a protective wall surface that extends vertically upward from the frame body and that forms a storage space for the silicon rod,
    the protective wall surface having a mesh structure having a mesh size of 2 Tyler mesh to 10 Tyler mesh,
    the protective structure further comprising a protective plate which is provided between the frame body and the bottom plate of the reactor and which has a flat surface that extends so as to surround the bottom plate and that spreads horizontally,
    the bottom plate having a bottom plate flange which is provided so as to surround the bottom plate,
    the reactor being formed by the bottom plate and a cover, the cover having a cover flange which is provided so as to surround the cover, and
    the frame body forming a circle having a diameter that is by 300 mm to 600 mm larger than an outer diameter of the bottom plate flange and the cover flange.

2. The protective structure according to claim 1, wherein the protective wall surface is capable of being divided along dividing lines extending vertically upward from respective points on the frame body.

3. The protective structure according to claim 1, wherein the protective wall surface includes a takeout window formed therein for taking out the silicon rod that is contained in the reactor.

4. A method for manufacturing a silicon rod, the method comprising a detaching step of detaching a cover from a bottom plate, together with which the cover forms a reactor in which the silicon rod is contained,
    the detaching step being carried out after a storage space for the silicon rod is formed by placing a protective structure including: a frame body that is shaped so as to surround the bottom plate; and a protective wall surface that extends vertically upward from the frame body and that has a mesh structure,
    the mesh structure having a mesh size of 2 Tyler mesh to 10 Tyler mesh,
    when the protective structure is placed, a protective plate being provided between the frame body and the bottom plate of the reactor, the protective plate having a flat surface that extends so as to surround the bottom plate and that spreads horizontally,
    the bottom plate having a bottom plate flange which is provided so as to surround the bottom plate,
    the cover having a cover flange which is provided so as to surround the cover, and
    the frame body forming a circle having a diameter that is by 300 mm to 600 mm larger than an outer diameter of the bottom plate flange and the cover flange.

* * * * *